(12) United States Patent
Chen

(10) Patent No.: US 6,531,406 B2
(45) Date of Patent: Mar. 11, 2003

(54) METHOD OF FABRICATING A SHALLOW TRENCH ISOLATION

(75) Inventor: Jain-Hon Chen, Chiayi (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/846,019

(22) Filed: Apr. 30, 2001

(65) Prior Publication Data

US 2002/0009865 A1 Jan. 24, 2002

Related U.S. Application Data

(62) Division of application No. 09/620,549, filed on Jul. 21, 2000, now Pat. No. 6,387,785.

(51) Int. Cl.$^7$ ............................................... H01L 21/00
(52) U.S. Cl. ..................... 438/745; 436/586; 436/424
(58) Field of Search ........................ 438/586, 745, 438/746, 747, 750, 757, 201, 211, 257, 424

(56) References Cited

U.S. PATENT DOCUMENTS 6,221,785 B1 * 4/2001 Tien ........................... 438/745
6,228,713 B1 * 5/2001 Pradeep et al. ............. 438/257
6,294,820 B1 * 9/2001 Lucas et al. ................. 257/412

* cited by examiner

Primary Examiner—David Nelms
Assistant Examiner—Dung Anh Le
(74) Attorney, Agent, or Firm—J. C. Patents

(57) ABSTRACT

A method of fabricating a shallow trench isolation, which is applicable on a substrate, is described. A pad oxide layer, a silicon oxynitride layer and a patterned photoresist layer are formed on the substrate, wherein a thickness of the silicon oxynitride layer is greater than 800 angstroms. Subsequently, the exposed silicon oxynitride layer is removed by using the photoresist layer as a mask, and the exposed pad oxide layer and a part of the substrate are removed by using the silicon oxynitride layer as a mask to form a shallow trench. An isolating material is then filled into the shallow trench to form a shallow trench isolation.

3 Claims, 3 Drawing Sheets

METHOD OF FABRICATING A SHALLOW TRENCH ISOLATION

CROSS REFERENCE TO A RELATED APPLICATION

The application is a divisional of an U.S. Ser. No. 09/620,549, now U.S. Pat. No. 6,387,785, filed on Jul. 21, 2000.

BACKGROUND OF THE INVENTION

1. Field of the Invention

The present invention relates to a fabrication process for semiconductors. More particularly, the present invention relates to a method of fabricating a shallow trench isolation using a bottom anti-reflection coating (BARC) and a hard mask.

2. Description of the Related Art

The lithography and etching process is very important for the manufacturing of semiconductors. The purpose of the lithography process is to form a patterned photoresist layer over the material layer to be patterned, and that of the etching process is to etch the exposed material layer using the patterned photoresist layer as a mask to obtain the patterned material layer. Since the photoresist layer is also being etched during the etching process, the thickness of the photoresist layer often increases as the requirement of the etching process increases to prevent the part of the material layer to be remained from being damaged during the etching process.

However, the resolution of the lithography and etching process decreases as the thickness of the photoresist layer increases. The thickness of the photoresist layer is thus limited. A hard mask layer of an inorganic material, as a result, is often used to replace the photoresist layer during the etching process. Such a process is accomplished by forming a hard mask layer over the material layer to be patterned followed by forming a patterned photoresist layer over the hard mask layer. Subsequently, the exposed hard mask layer is removed by using the photoresist layer as a mask. The exposed material layer is further removed by using the patterned hard mask layer as a mask.

The conventional material for the hard mask layer is silicon oxide or silicon nitride. However, the absorbency of silicon oxide or silicon nitride to the deep ultra-violet (DUV) light, such as one having the wavelength of 193 nm or 248 nm, used in the current exposing process is low. A hard mask layer of silicon oxide or silicon nitride cannot effectively absorb the deep ultra-violet light during an exposure process. The intensity of the light reflected from the surface of the material layer followed by penetrating through the hard mask layer remains strong enough to interfere with the incident light that enters the photoresist. The intensity of the reflected light will oscillate periodically as the thickness of the hard mask layer varies. It could lead to great variation both in the width of the patterned photoresist layer after development and in the critical dimension (CD) of the patterned material layer after etching. When the thickness of the respective hard mask layer is not uniformed due to the uneven surface of the substrate, the inconsistent critical dimension of the patterned material layer further adversely affects the quality of the integrated circuit device.

Furthermore, when the silicon nitride layer or silicon oxide layer is used as a hard mask, the intensity of the reflected light would vary according to thickness variation of the hard mask layer. Accordingly, the thickness of the hard mask layer on the same chip or chips from a different batch must be strictly controlled to the vicinity of the peak of oscillation of the intensity of the reflected light. This can avoid the excess critical dimensional variation of the patterned material layer to adversely affect the quality and consistency of the product. The consideration and cost of the process will increase due to the strict control for the thickness of the hard masking layer.

SUMMARY OF THE INVENTION

The present invention provides a method of fabricating a shallow trench isolation applicable to a substrate, which can resolve the above problems in the art using a hard masking layer, such as the problem of an inaccurate critical dimension caused by the high intensity of the reflected light. The process of the present invention comprises the steps of forming a material layer to be patterned on the substrate, then forming a silicon oxynitride layer of at least 800 angstroms in thickness, which can absorb deep ultra-violet light, over the material layer to completely absorb the reflected light from the surface of the material layer. A patterned photoresist is subsequently formed over said silicon oxynitide layer, followed by removing the exposed silicon oxynitride layer using said photoresist as a mask, and removing the exposed material layer using the patterned silicon oxynitride layer as a mask to form a patterned material layer.

Furthermore, to consider the thickness variation of the film caused by the uneven substrate surface or deviation in the processing condition, the silicon oxynitride layer of the present invention preferably has a thickness of more than 1100 angstroms to ensure a complete absorption of the reflected light from the surface of the material layer. Additionally, because silicon oxynitride has a broad absorption range to the wavelength of the deep ultra-violet light, the process of the present invention is applicable to a lithography and etching process using an exposure light source of 193 nm or 248 nm in wavelength.

In the first embodiment of the present invention, it is exemplified by the manufacturing process of a silicon gate, for example, a polysilicon layer or non-crystalline silicon layer is used as the above material layer and the patterned material layer is the gate. Such process for producing a gate is applicable to the process for producing dynamic random access memory (DRAM) or static random access memory (SRAM).

In the second embodiment of the present invention, it is exemplified by the patterning of a metal layer, for example, the above material layer is a metal layer, and the patterned material is a conductive line or an electrode plate for a capacitor.

In the third embodiment of the present invention, it is exemplified by the process for producing shallow trench isolation. In this case, the layer to be patterned is the substrate itself.

As mentioned in the above, since the thickness of the silicon oxynitride layer formed according to the present invention is more than 800 angstroms, it is used not only as the hard mask layer during the etching process, it is also used as the bottom anti-reflecting layer in the lithography process before the etching process, such that the resolution of the lithography process can be enhanced. Additionally, because the silicon oxynitride layer is more than 800 angstroms thick, the deep ultra-violet light reflected from the surface of the material layer can be absorbed completely by the silicon oxynitride layer. An inaccurate critical dimension caused by an uneven substrate surface or a non-uniform deposition can be prevented. Moreover, since the thickness of the silicon oxynitride layer is greater than 800 angstroms and is capable of completely absorbing the deep ultra-violet light reflected from the surface of the material layer, the thickness of the hard mask layer can be readily adjusted according to the demands of the etching process, without having to consider the issue of an inaccurate critical dimension caused by the thickness variation of the hard mask layer.

It is to be understood that both forgoing general description and the following detailed description are exemplary, and intended to provide further explanation of the invention as claimed.

BRIEF DESCRIPTION OF THE DRAWINGS

The accompanying drawings are included to provide a further understanding of the invention, and are incorporated in and constitute a part of this specification. The drawing illustrate embodiments of the invention and, together with the description, serve to explain the principles if the invention. In the drawings.

DESCRIPTION OF THE PREFERRED EMBODIMENT

The first embodiment

In this embodiment, the concept of the present invention is exemplified by the fabrication method of a gate, with reference to FIGS. 1A to 1D. Such fabrication method is applicable for the manufacturing of the gate of a dynamic random access memory (DRAM) device or a static random access memory (SRAM) device.

A substrate 100 is provided. A gate oxide layer 110 is formed over the substrate 100 by the method such as thermal oxidation. A silicon material layer 120, such as polysilicon or non-crystalline silicon, is then formed over the gate oxide layer 110 by the method such as low-pressure chemical vapor deposition (LPCVD). A silicon oxynitride layer 130 of at least 800 angstrom in thickness is formed over the silicon material layer 120 by the method such as plasma enhanced chemical vapor deposition (PECVD). Further, it is preferred that the silicon oxynitride layer 130 has the thickness of more than 1100 angstroms, in which the thickness variation of the silicon oxynitride layer 130 is included, to ensure a complete absorption of the deep ultra-violet light reflected from the surface of the silicon layer 120.

Figure 1A:
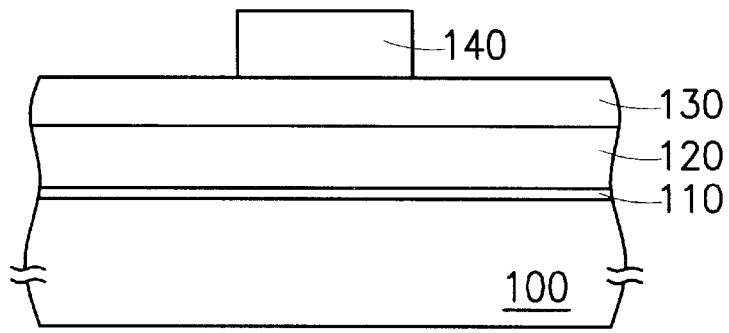
FIGS. 1A to 1C are schematic cross-sectional views showing the manufacturing of a gate according to the first embodiment of the present invention.

Still referring to FIG. 1A, a photoresist layer 140 is formed over the silicon oxynitride layer 130, followed by patterning the photoresist layer 140 by exposing the photoresist layer 140 to a deep ultra-violet light at a wavelength of 193 nm or 248 nm. The silicon oxynitride layer 130 can absorb the deep ultra-violet light reflected from the surface of the silicon layer 120 to greatly reduce the inaccuracy in the width of the patterned photoresist layer 140.

Figure 1B:
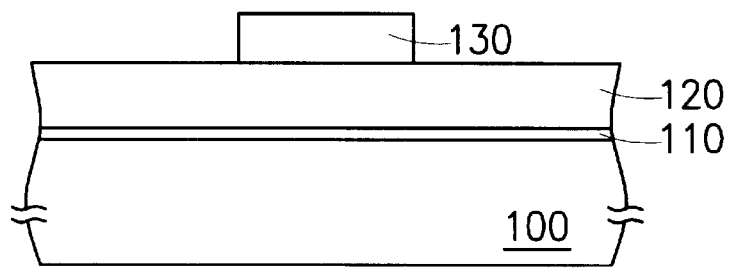

Referring to FIG. 1B, the exposed silicon oxynitride layer 130 is removed by the anisotropic etching using the photoresist layer 140 as a mask. The remaining silicon oxynitride layer 130 is then used as a hard mask layer.

Figure 1C:
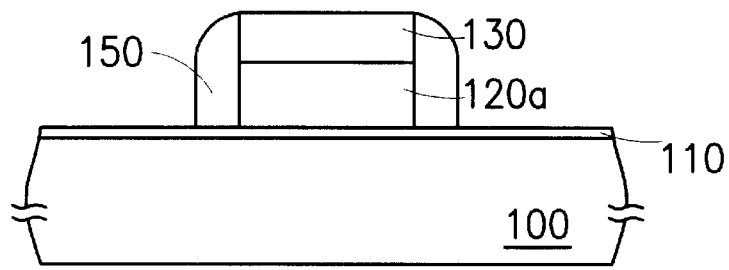

Referring to FIG. 1C, the exposed silicon material layer 120 is removed by anisotropic etching using the silicon oxynitride layer 130 as a mask to form a gate 120a. Since a short circuit between the gate 120a and the drain/source contact can be prevented by the silicon oxynitride layer 130 during the subsequent manufacturing of the drain/source contact, the silicon oxynitride layer 130 is not to be removed. Thereafter, a spacer 150 such as silicon nitride is formed on the sidewalls of the silicon oxynitride layer 130 and the gate 120a by means of deposition and anisotropic etching.

Figure 1D:
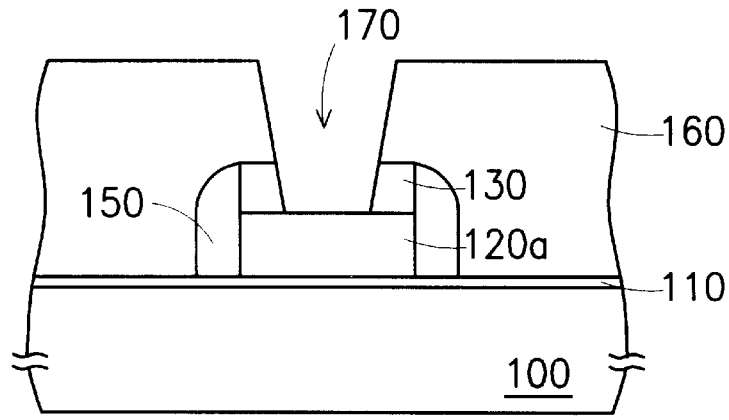
FIG. 1D is a schematic cross-sectional view showing the manufacturing of a contact hole over the gate.

Referring to FIG. 1D, the step of forming a contact opening 170 over the gate 120a is illustrated. Over the substrate 100, an isolating layer 160 is formed with a material such as silicon oxide. The isolating layer 160 and the silicon oxynitride layer 130 over the gate 120a are then etched to form a contact opening 170. When silicon oxide is used for the isolating layer 160, the isolating layer 160 and the silicon oxynitride layer 130 over the gate 120a can be etched in the same step, because silicon oxide and silicon oxynitride have similar etching rates.

The second embodiment

Figure 2A:
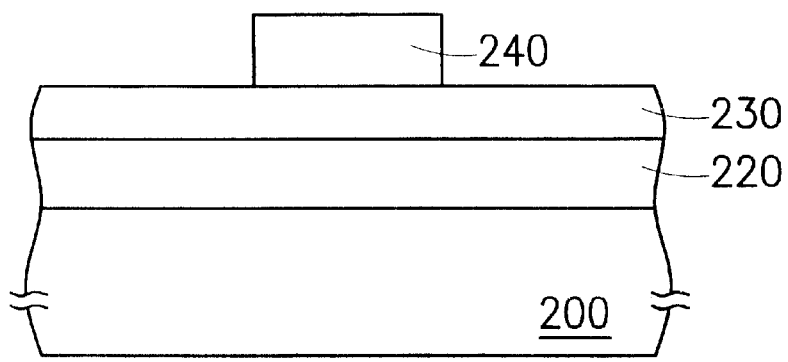
FIGS. 2A to 2C are schematic cross sectional views showing the manufacturing of a patterned metal layer according to the second embodiment of the present invention.
Figure 2B:
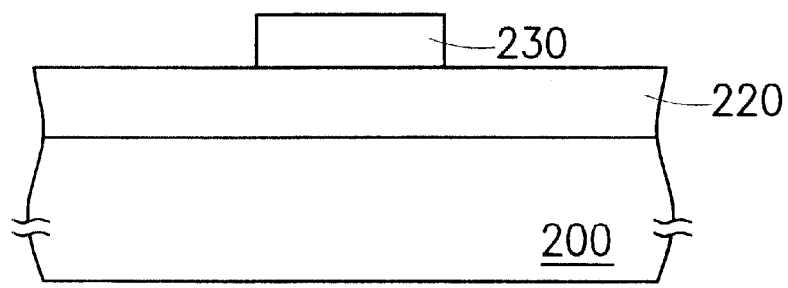
Figure 2C:
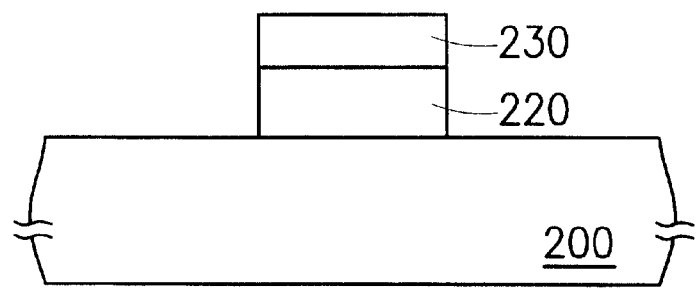

In this embodiment, the present invention is exemplified by a method of forming a patterned metal layer, with reference to FIGS. 2A to 2C.

Referring to FIG. 2A, a substrate 200 is provided. A metal layer 220 and a silicon oxynitride layer 230 are sequentially formed over the substrate 200. Such silicon oxynitride layer 230 has thickness of more than 800 angstroms and is formed by a method such as plasma enhanced chemical vapor deposition. Furthermore, to take into the consideration of the thickness variation, it is preferred that the thickness of the silicon oxynitride layer 230 is more than 1100 angstrom to ensure that the deep ultraviolet light reflected from the surface of the metal layer 220 be absorbed completely. Additionally, the silicon oxynitride nitride 230 would become thinner after etching. The thickness of the silicon oxynitride layer 230 can be adjusted according to the of the remaining thickness of the silicon oxynitride layer 230 after etching, provided that the thickness of the silicon oxynitride layer 230 is more than 800 angstrom.

Still referring to FIG. 2A, a photoresist layer 240 is formed over the silicon oxynitride layer 230, followed by patterning the photoresist layer 240 by exposing the photoresist layer to a deep ultra-violet light at a wavelength of 193 nm or 248 nm. Since the silicon oxynitride layer 230 can completely absorb the deep ultra-violet light reflected from the surface of the metal layer 220, the dimensional inaccuracy of the patterned photoresist layer 240 can be reduced greatly.

Referring to FIG. 2B, the exposed silicon oxynitride layer 230 is removed by the anisotropic etching using the photoresist layer 240 as a mask. The remaining silicon oxynitride layer 230 is used as a hard masking layer during the subsequent etching process.

Referring to FIG. 2C, the exposed metal layer 220 is removed by anisotropic etching using the silicon oxynitride layer 230 as a mask. The remaining metal layer 220 is, for example, a conductive line or an electrode plate for a capacitor. The removal of this silicon oxynitride layer 230 is determined by the result of an electrical analysis, for example, by whether the dielectric constant or the electric leakage resistance thereof meets the requirement of the product or not.

The third embodiment

In this embodiment, the present invention is exemplified by a fabrication method for a shallow trench isolation, with reference to FIGS. 3A to 3D.

Figure 3A:
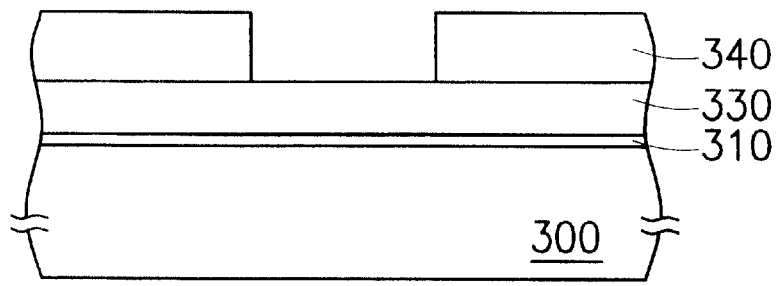
FIGS. 3A to 3D are schematic cross sectional views showing the manufacturing of a shallow trench isolation according to the third embodiment of the present invention.

Referring to FIG. 3A, a substrate 300 is provided. Over the substrate 300, a pad oxide 310 is formed by a method such as thermal oxidation or chemical vapor deposition. A silicon oxynitride layer 330 is formed over the pad oxide 310. Such silicon oxynitride layer 330 has thickness of more than 800 angstroms and is formed by a method such as plasma enhanced chemical vapor deposition. Furthermore, to take into the consideration of the thickness variation, it is preferred that the thickness of the silicon oxynitride layer 330 is more than 1100 angstroms to ensure that the deep ultraviolet light reflected from the surface of the substrate 300 be absorbed completely.

Still referring to FIG. 3A, a photoresist layer 340 is formed over the silicon oxynitride layer 330, followed by patterning the photoresist layer 340 by exposing the photoresist layer 340 to a deep ultra-violet light at a wavelength of 193 nm or 248 nm. Since the silicon oxynitride layer 330 can completely absorb the deep ultra-violet light reflected from the surface of the substrate 300, the dimensional inaccuracy of the patterned photoresist layer 340 can be reduced greatly.

Figure 3B:
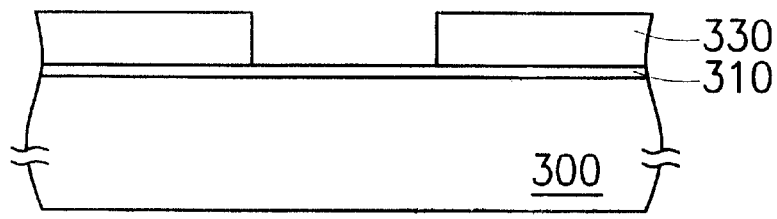

Referring to FIG. 3B, the exposed silicon oxynitride layer 330 is removed by the anisotropic etching using the photoresist layer 340 as a mask. The remaining silicon oxynitride layer 330 is used as a hard masking layer during the subsequent etching process.

Figure 3C:
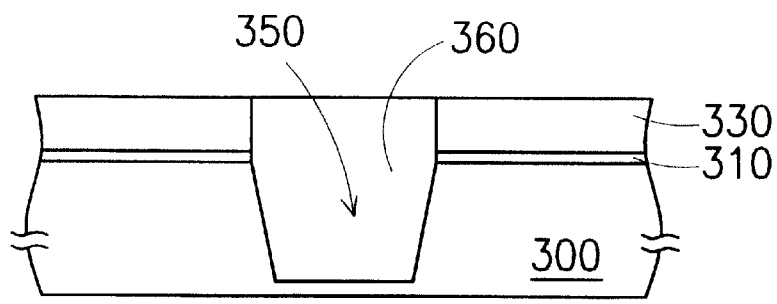

Referring to FIG. 3C, the exposed pad oxide 310 and a part of the substrate 300 are in turn removed by using the silicon oxynitride layer 330 as a mask to form a shallow trench 350. An isolating material is filled into the shallow trench 350 to form the shallow trench isolation 360. The methods used for the above two steps are plasma chemical vapor deposition and subsequent chemical mechanical polishing. The isolation material is, for example, silicon oxide.

Figure 3D:
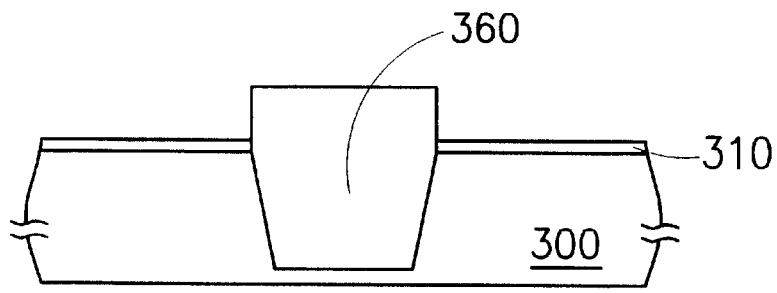

Referring to FIG. 3D, the silicon oxynitride layer 330 is finally removed to accomplish such process. The method of removing such silicon oxynitride layer 330 is by wet etching with hot phosphoric acid or dry etching.

As mentioned in the above, in the lithography and etching process according to the present invention, a silicon oxynitride layer (130, 230 or 330) that can absorb the deep ultra-violet light is used as the hard mask layer when the material layer (the silicon layer 120, the metal layer 220, or the substrate 300) is etched. The hard mask layers thus can be used as a bottom anti-reflecting layer in the lithography process before the etching process, and the resolution of the lithography process can be enhanced.

The deep ultra-violet light reflected from the surfaces of the material layer (the silicon layer 120, the metal layer 220 or the substrate 300) can be absorbed completely by the silicon oxynitride layer (130, 230 or 330) when the respective thickness of the silicon oxynitride layer (130, 230, 330) is more than 800 angstroms. The occurrence of the critical dimensional inaccuracy caused by an uneven substrate surface or an inconsistent thickness of the deposited layer can be prevented, such that the quality and consistency of the devices can be increased.

Furthermore, a silicon oxynitride layer (130, 230 or 330) with a thickness greater than 800 angstroms is capable of completely absorbing the deep ultra-violet light reflected from the surface of the material layer (the silicon layer 120, the metal layer 220, the substrate 300). Therefore, the respective thickness of the silicon oxynitride layers (130, 230, 330) can be readily modulated according to the requirement of the etching process, provided that the thickness thereof is kept to be more than 800 angstroms. It can be achieved without consideration of the problems of the critical dimensional inaccuracy caused by the varied thickness.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A manufacturing process for a shallow trench isolation, applicable to a substrate, comprising:

forming a pad oxide layer, a silicon oxynitride layer and a patterned photoresist layer on the substrate, wherein a thickness of the silicon oxynitride layer is greater than 800 angstroms;

removing the exposed silicon oxynitride layer by using the photoresist layer as a mask;

removing the exposed pad oxide layer and a part of the substrate by using the silicon oxynitride layer as a mask to form a shallow trench;

filling an isolating material into the shallow trench to form a shallow trench isolation; and removing the silicon oxynitride layer.

2. The process according to claim 1, wherein a thickness of the silicon oxynitride layer is more than 1100 angstroms.

3. The process according to claim 1, wherein a wavelength of an exposure source is 193 nm or 248 nm when the patterned photoresist layer is formed.

* * * * *